(12) United States Patent
Wang (10) Patent No.: US 11,848,408 B2
(45) Date of Patent: Dec. 19, 2023

(54) DRIVE CIRCUIT SUBSTRATE, LED DISPLAY PANEL AND METHOD OF FORMING THE SAME, AND DISPLAY DEVICE

(71) Applicant: BOE TECHNOLOGY GROUP CO., LTD., Beijing (CN)

(72) Inventor: Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 613 days.

(21) Appl. No.: 17/054,746

(22) PCT Filed: Dec. 2, 2019

(86) PCT No.: PCT/CN2019/122385
§ 371 (c)(1),
(2) Date: Nov. 11, 2020

(87) PCT Pub. No.: WO2021/108951
PCT Pub. Date: Jun. 10, 2021

(65) Prior Publication Data
US 2021/0367120 A1     Nov. 25, 2021

(51) Int. Cl.
*H01L 29/08* (2006.01)
*H01L 33/62* (2010.01)
(Continued)

(52) U.S. Cl.
CPC ............... *H01L 33/62* (2013.01); *G09G 3/32* (2013.01); *H01L 25/0753* (2013.01); *H01L 33/387* (2013.01); *H01L 33/0066* (2013.01)

(58) Field of Classification Search
CPC ... H01L 33/62; H01L 25/0753; H01L 33/387; H01L 33/0066; H01L 27/153;
(Continued)

(56) References Cited

U.S. PATENT DOCUMENTS

| | | | |
|---|---|---|---|
| 2008/0017873 A1* | 1/2008 | Tomoda | H01L 24/11 257/E23.021 |
| 2018/0172740 A1* | 6/2018 | Marenski | G01R 15/14 |
| 2018/0182740 A1 | 6/2018 | Kim et al. | |

FOREIGN PATENT DOCUMENTS

| | | |
|---|---|---|
| CN | 208014728 U | 10/2018 |
| CN | 110100309 A | 8/2019 |

(Continued)

*Primary Examiner* — Niki H Nguyen
(74) *Attorney, Agent, or Firm* — McCoy Russell LLP (57) ABSTRACT

A drive circuit substrate, an LED display panel and a method of forming the same and a display device are provided, relates to the field of display technologies. The drive circuit substrate includes a base substrate and a plurality of drive electrodes arranged in an array on a surface of the base substrate. The driving electrodes include a first driving electrode and a second driving electrode, a horizontal height of the first driving electrode is greater than a horizontal height of the second driving electrode. The conductive structure includes a first conductive structure on a surface of the first driving electrode away from the base substrate and a second conductive structure on a surface of the second driving electrode away from the base substrate, a height of the second conductive structure is greater than a height of the first conductive structure.

20 Claims, 3 Drawing Sheets

(51) Int. Cl.
  *G09G 3/32* (2016.01)
  *H01L 25/075* (2006.01)
  *H01L 33/38* (2010.01)
  *H01L 33/00* (2010.01)

(58) Field of Classification Search
  CPC .............. H01L 33/08; H01L 33/36; H01L 2924/13069; H01L 2224/16; H01L 2021/775; H01L 29/40; H01L 31/00; H01L 27/14625; G09G 3/32; G02F 1/13454; G02F 1/136227; G02F 1/1368; G02F 1/136286; G02F 1/136; G02F 1/136213; G02F 1/133345; G02F 1/133512; G02F 1/13439; G02F 1/134309; G02F 1/13458; G02F 1/1506; G02F 2201/124; G02F 1/133504; G02F 1/133526; G02F 1/1336; G02F 1/133742; G02F 1/133302; G02F 1/133761; G02F 1/13392; G02F 1/1341; G02F 1/134381; G02F 1/1354; H10K 50/8445; H10K 59/17; H10K 59/878; H10K 2102/351; H10K 50/131; H10K 50/86; H10K 50/816; H10K 71/231; H10K 7/50
  See application file for complete search history.

(56) References Cited

FOREIGN PATENT DOCUMENTS

| | | |
|---|---|---|
| CN | 110299377 A | 10/2019 |
| CN | 110957411 A | 4/2020 |
| CN | 110970457 A | 4/2020 |
| JP | 2008027933 A | 2/2008 |

* cited by examiner

DRIVE CIRCUIT SUBSTRATE, LED DISPLAY PANEL AND METHOD OF FORMING THE SAME, AND DISPLAY DEVICE

CROSS-REFERENCE TO RELATED APPLICATIONS

The present application is a U.S. National Phase of International Application No. PCT/CN2019/122385, entitled "DRIVE CIRCUIT SUBSTRATE, LED DISPLAY PANEL AND METHOD OF FORMING THE SAME, AND DISPLAY DEVICE," and filed on Dec. 2, 2019. The entire contents of the above-listed application are hereby incorporated by reference for all purposes.

TECHNICAL FIELD

The present disclosure relates to the field of display technologies, and in particular, to a drive circuit substrate, an LED display panel and a method of forming the same, and a display device.

BACKGROUND

In recent years, the Organic Light-Emitting Diode (OLED) display panel rapidly develops due to its characteristics of high contrast, flexibility and the like, and gradually replaces the market position of the liquid crystal panel. The micro LED display panel is widely considered as a substitute for the OLED panel due to its excellent brightness, lifetime, contrast, response time, energy consumption, viewing angle, resolution, and other indexes.

SUMMARY

A drive circuit substrate, an LED display panel and a method of forming the same and a display device are provided in the embodiments of the present disclosure.

The technical scheme of the embodiments of the present disclosure is described as follows.

A drive circuit substrate is provided in an embodiment of the present disclosure, including a base substrate and a plurality of drive electrodes arranged in an array on a surface of the base substrate, where at least one conductive structure is arranged on a surface of each drive electrode away from the base substrate, the conductive structure is electrically connected to the corresponding drive electrode, and an orthographic projection of the conductive structure onto the base substrate is within an orthographic projection of the corresponding drive electrode onto the base substrate;

the driving electrodes include a first driving electrode and a second driving electrode, a horizontal height of the first driving electrode is greater than a horizontal height of the second driving electrode, the conductive structure includes a first conductive structure on a surface of the first driving electrode away from the base substrate and a second conductive structure on a surface of the second driving electrode away from the base substrate, a height of the second conductive structure is greater than a height of the first conductive structure, the horizontal height of the first driving electrode is a distance from the surface of the first driving electrode away from the base substrate to a surface of the base substrate close to the first driving electrode, the horizontal height of the second driving electrode is a distance from the surface of the second driving electrode away from the base substrate to a surface of the base substrate close to the second driving electrode.

Optionally, in at least two conductive structures corresponding to a same driving electrode, a distance between adjacent conductive structures is 3 μm to 5 μm.

Optionally, a difference between the horizontal height of the first driving electrode and the horizontal height of the second driving electrode is D, the height of the first conductive structure is H1, the height of the second conductive structure is H2, and a difference between H2 and H1 is not less than D.

Optionally, the height of the conductive structure is 10 μm to 30 μm.

Optionally, a size of a cross section of the conductive structure on a plane parallel to the base substrate is inversely related to a distance from the cross section to a surface of the drive electrode.

Optionally, a ratio of a minimum dimension of a surface of the conductive structure facing the base substrate in a direction parallel to the base substrate to a distance from a top of the conductive structure to the drive electrode ranges from 1:1 to 1:3.

Optionally, a shape of the conductive structure is at least one of cone, truncated cone and triangular prism, a bottom surface of the conductive structure is on the surface of the driving electrode away from the base substrate in a case that the conductive structure is a cone or a truncated cone, and a lateral surface of the conductive structure is on the surface of the driving electrode away from the base substrate in a case that the conductive structure is a triangular prism.

Optionally, the conductive structure includes a first portion and a second portion covering the first portion, an orthographic projection of the first portion onto the base substrate is within an orthographic projection of the driving electrode onto the base substrate, the second portion is in contact with the driving electrode, the second portion is conformal with a surface of the first portion away from the base substrate, the first portion is made of a dielectric material, and the second portion is made of a conductive material.

Optionally, the dielectric material includes an organic material, and the conductive structure further includes an inorganic material layer between the first portion and the second portion and covering the first portion.

Optionally, the second portion further covers a surface of the drive electrode close to the first portion.

Optionally, the conductive structure is made of a conductive material.

Optionally, the driving electrode is integrally formed with the conductive structure, and a ratio of a thickness of the driving electrode to a distance from a top of the conductive structure to a bottom of the driving electrode ranges from 1:4 to 1:2.

Optionally, a hardness of the conductive material is greater than or equal to 5.5 Mohs scale.

Optionally, the conductive material is at least one of tungsten, nickel, titanium and molybdenum.

A method of forming a drive circuit substrate is further provided in an embodiment of the present disclosure, including:

providing a base substrate;

forming a drive circuit including a plurality of driving electrodes arranged in an array on the base substrate;

forming at least one conductive structure on a surface of each drive electrode away from the base substrate, where the conductive structure is electrically connected to the corresponding drive electrode, and an orthographic projection of the conductive structure onto the base substrate is within an orthographic projection of the corresponding drive electrode onto the base substrate;

where the driving electrodes include a first driving electrode and a second driving electrode, a horizontal height of the first driving electrode is greater than a horizontal height of the second driving electrode, the conductive structure includes a first conductive structure on a surface of the first driving electrode away from the base substrate and a second conductive structure on a surface of the second driving electrode away from the base substrate, a height of the second conductive structure is greater than a height of the first conductive structure, the horizontal height of the first driving electrode is a distance between the surface of the first driving electrode away from the base substrate and a surface of the base substrate close to the first driving electrode, the horizontal height of the second driving electrode is a distance between the surface of the second driving electrode away from the base substrate and a surface of the base substrate close to the second driving electrode.

An LED display panel is further provided in an embodiment of the present disclosure, including the drive circuit substrate hereinabove and an LED substrate oppositely arranged with the drive circuit substrate to form a cell, where the LED substrate includes a plurality of LEDs on a carrier plate, and electrodes of the LED chips and the driving electrodes of the drive circuit substrate are in a one-to-one correspondence and are electrically connected through the conductive structure.

A method of forming an LED display panel is further provided in an embodiment of the present disclosure, including:

providing the drive circuit substrate hereinabove;

providing an LED substrate, where the LED substrate includes a plurality of LEDs on a carrier plate, and electrodes of the LED chips and the driving electrodes of the drive circuit substrate are in a one-to-one correspondence; and aligning the LED substrate with the drive circuit substrate, to electrically connect the conductive structures on the driving electrodes to the electrodes of the LED chips, and an orthographic projection of the electrode of each LED chip onto the drive circuit substrate covers an orthographic projection of a top of the conductive structure on the corresponding driving electrode onto the drive circuit substrate.

Optionally, the method further includes: applying a pressure onto the LED substrate or the drive circuit substrate according to claim 5, to insert the conductive structure on the driving electrode into the electrode of the LED chip corresponding to the driving electrode.

Optionally, in a case that the LED substrate is aligned with the drive circuit substrate, a maximum distance between the LED substrate and the drive circuit substrate is D1, a minimum distance between the LED substrate and the drive circuit substrate is D2, a height of the first conductive structure is H1, and H1 is greater than or equal to (D1−D2).

A display device including the LED display panel hereinabove is further provided in an embodiment of the present disclosure.

The advantageous effects of the embodiments of the present disclosure is described as follows.

According to the above scheme, the horizontal height of the first driving electrode on the drive circuit substrate is greater than the horizontal height of the second driving electrode on the drive circuit substrate, the height of the second conductive structure on the surface of the second driving electrode away from the base substrate is greater than the height of the first conductive structure on the surface of the first driving electrode away from the base substrate, therefore after the drive circuit substrate and the LED substrate are oppositely arranged to form a cell, each driving electrode may be electrically connected to the electrode of the corresponding LED chip, thereby improving the binding yield of the LED display panel.

REFERENCE NUMERALS

1 substrate base plate
2 drive electrode
21 first drive electrode
22 second drive electrode
3 tapered body
31 first tapered body
32 second tapered body
4 carrier plate
5 micro LED chip
61 first electrode
62 second electrode
7 conductive layer
8 conductive structure
81 first conductive structure
82 second conductive structure
9 inorganic material layer.

DETAILED DESCRIPTION

To make the technical problems, technical solutions and advantages to be solved by the embodiments of the present disclosure clearer, the following detailed description is given with reference to the drawings and embodiments.

The inorganic light emitting diode display panel is an active light emitting display structure, i.e. a backlight source is not needed. The micro-inorganic light emitting diode display panel uses a micro-inorganic light emitting diode array as a light emitting pixel, and the LED structure design needs to be thinned, miniaturized and arrayed, namely, a chip is miniaturized to a micron level of only tens of microns to dozens of microns, and is transferred to a drive circuit substrate in a huge amount. In the related art, when an LED display panel is manufactured, solder paste is coated on a driving electrode of a drive circuit substrate, or the LED substrate and the drive circuit substrate are bonded together after being oppositely arranged to form a cell.

Figure 1:
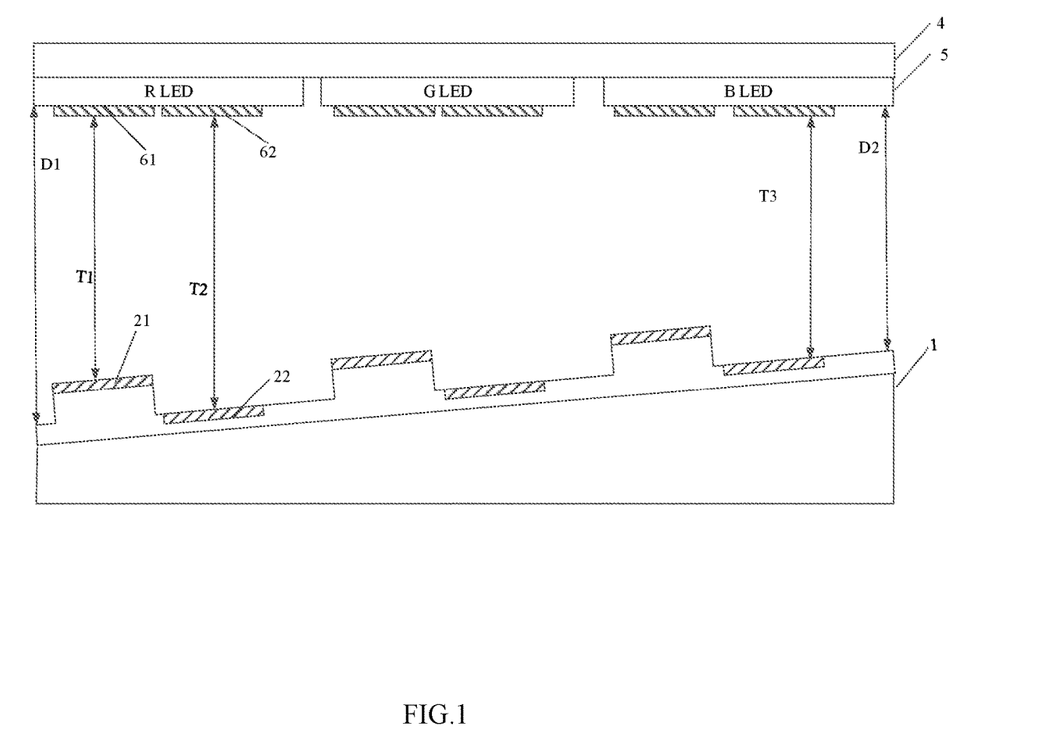
FIG. 1 is a schematic view of a cell formed by oppositely arranging an LED substrate and a drive circuit substrate.

As shown in FIG. 1, when the LED substrate and the drive circuit substrate are oppositely arranged to form a cell, because there is a level difference between different areas of the base substrate 1 of the drive circuit substrate, and there is a level difference between different areas of the film layer of the drive circuit substrate, so there is a difference in distance between the LED chip of the LED substrate and the driving electrode of the drive circuit substrate at different positions, for example, in the whole substrate range, the distance T1, T2 between the driving electrode on the left side of the base substrate 1 and the LED chip may have a difference of several micrometers or tens of micrometers compared with the distance T3 between the driving electrode on the right side of the base substrate 1 and the LED chip, so that the step of the drive circuit substrate itself may cause a difference in the bonding yield of the LEDs on the left side and the right side of the LED display panel after forming the cell.

A drive circuit substrate, an LED display panel and a method of forming the same and a display device are provided in the embodiments of the present disclosure.

A drive circuit substrate is provided in an embodiment of the present disclosure, including a base substrate and a plurality of drive electrodes arranged in an array on a surface of the base substrate, where at least one conductive structure is arranged on a surface of each drive electrode away from the base substrate, the conductive structure is electrically connected to the corresponding drive electrode, and an orthographic projection of the conductive structure onto the base substrate is within an orthographic projection of the corresponding drive electrode onto the base substrate;

the driving electrodes include a first driving electrode and a second driving electrode, a horizontal height of the first driving electrode is greater than a horizontal height of the second driving electrode, the conductive structure includes a first conductive structure on a surface of the first driving electrode away from the base substrate and a second conductive structure on a surface of the second driving electrode away from the base substrate, a height of the second conductive structure is greater than a height of the first conductive structure, the horizontal height of the first driving electrode is a distance from the surface of the first driving electrode away from the base substrate to a surface of the base substrate close to the first driving electrode, the horizontal height of the second driving electrode is a distance from the surface of the second driving electrode away from the base substrate to a surface of the base substrate close to the second driving electrode.

According to the above embodiment, the horizontal height of the first driving electrode on the drive circuit substrate is greater than the horizontal height of the second driving electrode on the drive circuit substrate, the height of the second conductive structure on the surface of the second driving electrode away from the base substrate is greater than the height of the first conductive structure on the surface of the first driving electrode away from the base substrate, therefore after the drive circuit substrate and the LED substrate are oppositely arranged to form a cell, each driving electrode may be electrically connected to the electrode of the corresponding LED chip, thereby improving the binding yield of the LED display panel.

If the distance between adjacent conductive structures on the same driving electrode is too small, the difficulty of the preparation process is increased; if the distance between the adjacent conductive structures on the same driving electrode is too large, the number of the conductive structures on the same driving electrode is small, and the reliability of the electrical connection between the driving electrode and the electrode of the LED chip is adversely effected, so that the distance between the adjacent conductive structures in at least two conductive structures corresponding to the same driving electrode may be 3-5 μm, so that the reliability of the electrical connection between the driving electrode and the electrode of the LED chip may be ensured.

Figure 4:
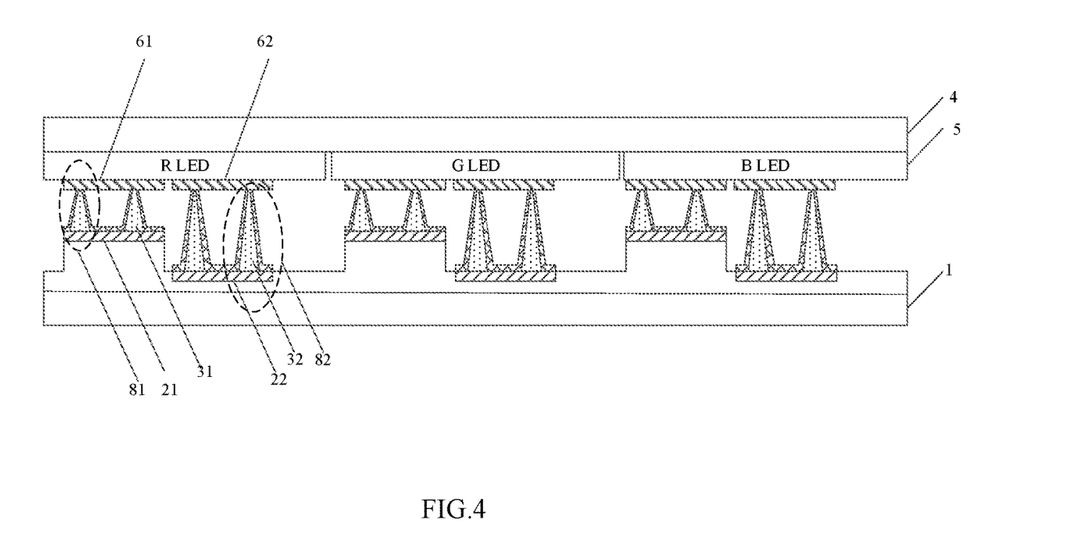
FIG. 4 is a schematic view of an LED display panel in an embodiment of the disclosure.

As shown in FIG. 4, each LED chip has a first electrode 61 and a second electrode 62, and an electrical signal is applied to the first electrode 61 and the second electrode 62, so that the LED chip may emit light. In the LED display panel, an electrical signal is transmitted to the electrodes of the LED chip through the driving electrodes on the drive circuit substrate, and accordingly, the driving electrodes of the drive circuit substrate include the first driving electrodes 21 corresponding to the first electrodes 61 of the LED chip and the second driving electrodes 22 corresponding to the second electrodes 62 of the LED chip.

Figure 2:
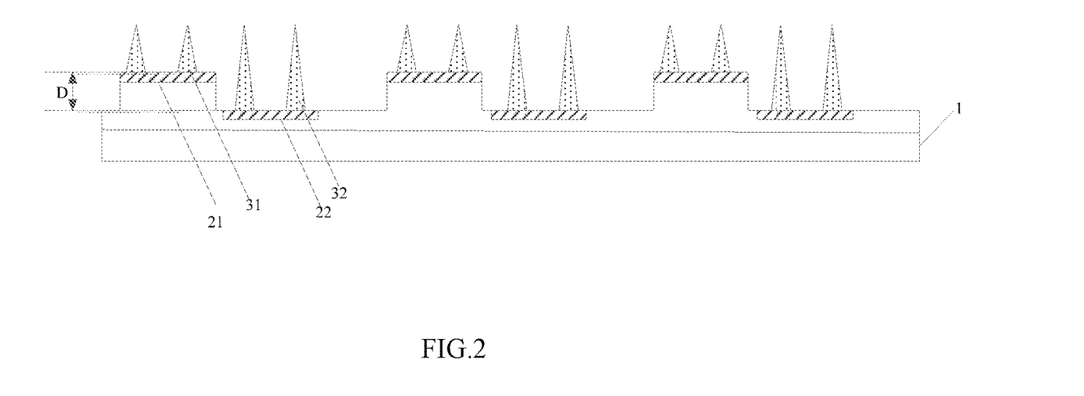
FIG. 2 is a schematic view of a tapered body on a drive electrode in an embodiment of the present disclosure.
Figure 3:
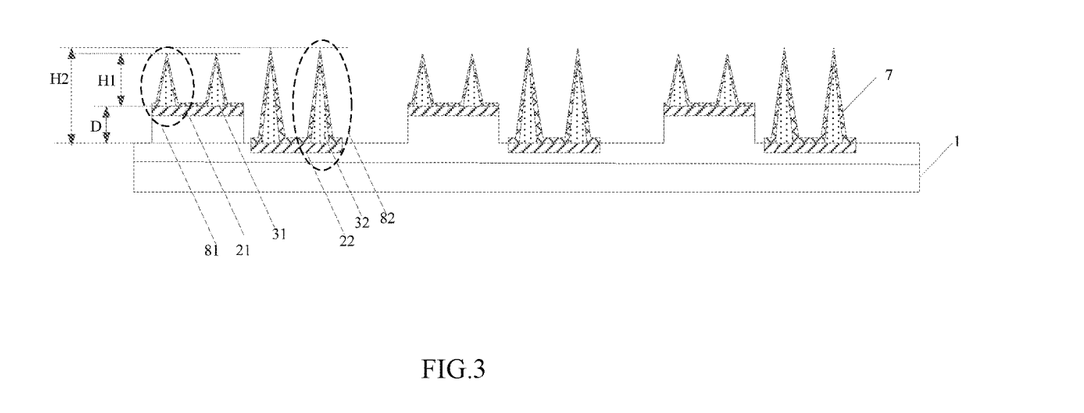
FIG. 3 is a schematic view of a conductive layer formed on a tapered body in an embodiment of the disclosure.

As shown in FIG. 2 and FIG. 3, there is a level difference in the drive circuit substrate itself, for example, the horizontal height of the first driving electrode 21 is greater than the horizontal height of the second driving electrode 22, the difference between the horizontal height of the first driving electrode 21 and the horizontal height of the second driving electrode 22 is D. The horizontal height of the first driving electrode 21 is a distance from the surface of the first driving electrode 21 away from the base substrate 1 to a surface of the base substrate 1 close to the first driving electrode 21, the horizontal height of the second driving electrode 22 is a distance from the surface of the second driving electrode 22 away from the base substrate 1 to a surface of the base substrate 2 close to the second driving electrode 22. The conductive structure includes a first conductive structure 81 on a surface of the first driving electrode 21 away from the base substrate 1 and a second conductive structure 82 on a surface of the second driving electrode 22 away from the base substrate 1, where the height of the first conductive structure 81 is H1, the height of the second conductive structure 82 is H2, and the height of the conductive structure is the distance from the vertex of the conductive structure to the surface of the driving electrode away from the base substrate. In order to ensure the binding yield of the LED chips, after the LED substrate and the drive circuit substrate are oppositely arranged to form a cell, each driving electrode may be electrically connected to the electrode of the corresponding LED chip, H2 is larger than H1, a difference between H2 and H1 is not smaller than D, and the difference between H2 and H1 is not larger than 15 μm; where 15 μm is the maximum level difference between two drive electrodes under the current process conditions. If the difference between H2 and H1 is too large, the first conductive structure 81 may not be able to contact the electrode of the LED chip when the second conductive structure 82 is electrically connected to the electrode of the LED chip.

Specifically, before the conductive structure is formed, the drive circuit substrate may be measured to obtain the D value, and then the values of H1 and H2 may be determined according to the D value, and then the conductive structure may be formed according to the values of H1 and H2. Specifically, the entire drive circuit substrate may be measured by a level difference measuring machine to obtain the D value.

The range of the level difference of the film layer on the drive circuit substrate is about 1-5 μm, the level difference of the base substrate of the drive circuit substrate is about 10 μm, in order to ensure that each driving electrode can be electrically connected to the electrode of the corresponding LED chip after the drive circuit substrate and the LED substrate are oppositely arranged to form a cell, the height H2 of the conductive structure arranged above the driving electrode with the smaller horizontal height is larger than the height H1 of the conductive structure arranged above the driving electrode with the larger horizontal height, the difference between H2 and H1 is not smaller than D, and the difference between H2 and H1 is not larger than 15 μm. Therefore, the height of the conductive structure may be controlled within 10-30 μm.

In the related art, binding LEDs includes several different methods. One method is to use solder paste for bonding, but the solder paste needs to be heated during the bonding, the heating unnecessarily deteriorates the performance of the Micro LED, and the coating precision of the solder paste cannot meet the manufacturing requirements of the Micro LED display substrate. One method is to use anisotropic conductive adhesive for bonding, which is expensive. One method is to transfer the adhesive by direct metal-to-metal contact, and the adhesive between the metals is not easily discharged, which reduces the contact area between the metals.

According to the embodiments of the present disclosure, a size of a cross section of the conductive structure on a plane parallel to the base substrate is inversely related to a distance from the cross section to a surface of the drive electrode, and the "inversely related" means that the larger the distance from the cross section to the surface of the driving electrode, the smaller the area of the cross section will be. When the LED display panel is manufactured, after the drive circuit substrate and the LED substrate are oppositely arranged to form a cell, the conductive structure on the drive electrode may be inserted into the electrode of the LED chip corresponding to the drive electrode by applying a pressure to the LED substrate or the drive circuit substrate, and the electric connection between the drive electrode and the electrode of the LED chip may be realized. The conductive structure may be formed by a patterning process, the patterning process has a high production precision, which may meet the manufacturing requirement of the LED display panel in a micron level.

In the embodiment of the present disclosure, a ratio of an area occupied by the conductive structure in an area where an orthographic projection of the surface of the driving electrode is located to the surface area of the driving electrode may be greater than 20%.

In an exemplary embodiment of the present disclosure, a ratio of a minimum dimension of a surface of the conductive structure facing the base substrate in a direction parallel to the base substrate to a distance from a top of the conductive structure to the drive electrode ranges from 1:1 to 1:3.

As shown in FIG. 3, the first driving electrode 21 and the second driving electrode 22 are both provided with a conductive structure, and when the LED display panel is manufactured, after the LED substrate and the drive circuit substrate are oppositely arranged to form a cell, a pressure is applied to the LED substrate and/or the drive circuit substrate, so that the conductive structure is inserted into the electrode of the LED chip, and thus the driving electrode and the electrode of the LED chip may be electrically connected. In order to ensure the reliability of the electrical connection, a plurality of conductive structures may be disposed on each of the first driving electrodes 21 and a plurality of conductive structures may be disposed on each of the second driving electrodes 22. When a plurality of conductive structures are arranged on each driving electrode, the conductive structures are uniformly distributed as far as possible in the area opposite to the driving electrodes and the electrodes of the LED chips, so that the reliability of the electric connection between the driving electrodes and the electrodes of the LED chips may be ensured. The area opposite to the first drive electrode 21 and the first electrode 61 refers to the overlapping area of the orthographic projection of the first electrode 61 on the first drive electrode 21 and the first drive electrode 21 after the LED substrate and the drive circuit substrate are oppositely arranged to form a cell. The area opposite to the second driving electrode 22 and the second electrode 62 refers to the overlapping area of the orthographic projection of the second electrode 62 on the second driving electrode 22 and the second driving electrode 22 after the LED substrate and the drive circuit substrate are oppositely arranged to form a cell.

A shape of the conductive structure is at least one of cone, truncated cone and triangular prism, for example, the conductive structure may be a pyramid, a cone, or a triangular prism, but the conductive structure is not limited to a pyramid, a cone, and a triangular prism, and may be other types of conductive structures as long as the conductive structure can be inserted into a vertex of an electrode of an LED chip.

A bottom surface of the conductive structure is on the surface of the driving electrode away from the base substrate in a case that the conductive structure is a cone or a truncated cone, and a lateral surface of the conductive structure is on the surface of the driving electrode away from the base substrate in a case that the conductive structure is a triangular prism.

The conductive structure may be made of a conductive material, but because the limitation of the current preparation process is that the film-forming thickness of the conductive material is generally small and less than 1 micron, and the height requirement of the conductive structure cannot be met temporarily, the tapered body may be made by a dielectric material such as organic resin, then a conductive layer is formed on the tapered body, and then the conductive structure is formed by the tapered body and the conductive layer covering the tapered body.

Figure 5:
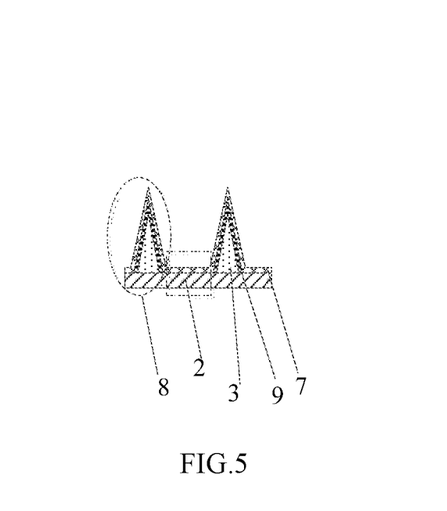
FIGS. 5 and 6 are schematic structural views of a conductive structure in an embodiment of the disclosure.

In the embodiment of the present disclosure, the conductive structure includes a first portion and a second portion covering the first portion, an orthographic projection of the first portion onto the base substrate is within an orthographic projection of the driving electrode onto the base substrate, the second portion is in contact with the driving electrode, the second portion is conformal with a surface of the first portion away from the base substrate, the first portion is made of a dielectric material, and the second portion is made of a conductive material. In order to ensure that, as shown in FIG. 5, the first portion of the conductive structure 8 of the electrode of the conductive structure LED chip may be made to be a tapered shape, i.e. a tapered body 3; the second part needs to have conductive properties, i.e. the above-mentioned conductive layer 7.

By way of example, the dielectric material may include an organic material. Further, the organic material may include an organic resin material, as an example. For example, the organic resin material may include polyimide type resin or acrylic type resin.

By way of example, the conductive material may include aluminum, copper, molybdenum, titanium, tungsten, or the like.

The conductive structure further includes an inorganic material layer between the first portion and the second portion and covering the first portion. As shown in FIG. 5, the conductive structure 8 includes an inorganic material layer 9 between the tapered body 3 and the conductive layer 7, it is noted that the inorganic material layer 9 may protect the underlying dielectric material (i.e., the tapered body 3) during the forming of the conductive layer 7 of the conductive structure. For example, when the conductive layer 7 is formed by sputtering, the sputtered ions (e.g., metal ions) will keep striking the surface of the tapered body 3 and generate a large amount of heat, which causes deformation such as collapse of a dielectric material such as an organic material of the tapered body 3.

In the embodiment of the present disclosure, the material of the inorganic material layer 9 may include, for example, silicon nitride (SiNx), silicon oxide (SiOx), or the like.

In the embodiment of the present disclosure, the second portion of the conductive structure 8 also covers the surface of the drive electrode close to the first portion. This arrangement enables the conductive structure 8 to be more effectively electrically connected to the drive electrode 2, thereby further reducing contact resistance, as shown in the dotted rectangular box in FIG. 5.

In the embodiments of the present disclosure, the conductive structure 8 may also be made of only a conductive material.

Figure 6:
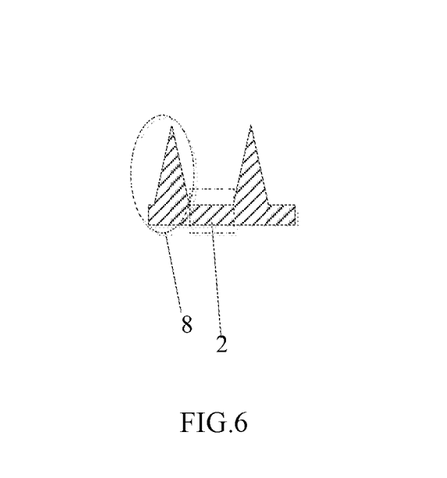

In the embodiment of the present disclosure, the drive electrode 2 and the conductive structure 8 may be integrally formed, as shown in FIG. 6. That is, the drive electrode 2 is composed of the same material and formed in the same step as the conductive structure 8.

The driving electrode is integrally formed with the conductive structure, and a ratio of a thickness of the driving electrode to a distance from a top of the conductive structure to a bottom of the driving electrode ranges from 1:4 to 1:2.

In some embodiments of the present disclosure, as shown in FIG. 3, the first conductive structure 81 on the first driving electrode 21 includes a first tapered body 31 and a conductive layer 7 covering the first tapered body 31; the second conductive structure 82 on the second drive electrode 22 includes the second tapered body 32 and the conductive layer 7 covering the second tapered body 32.

Specifically, the tapered body may be made of organic materials such as acrylic and polyimide. For example, when the tapered body is made of an organic photosensitive material, an organic photosensitive material layer may be formed on the base substrate 1 on which the driving electrode is formed, the organic photosensitive material layer is exposed by using a mask plate, the mask plate includes a semitransparent pattern corresponding to the forming region of the tapered body and a transparent pattern corresponding to other regions. The transmittance of the semitransparent pattern gradually decreases in a direction away from the edge close to the forming region of the tapered body. After the developing process, according to the different exposure extents, the organic photosensitive material layer are removed by different amounts at different regions, then the tapered body may be formed. The height of the tapered body can be controlled by controlling the light transmittance of the semitransparent pattern, so that the tapered bodies with different heights are formed on different driving electrodes.

As shown in FIG. 3, the conductive layer 7 covers not only the tapered bodies, but also the exposed driving electrodes between adjacent tapered bodies, so that the conductive structure can be electrically connected to the driving electrode through the contact part of the conductive layer 7 and the driving electrodes.

In order to ensure that the conductive structure may be inserted into the electrode of the LED chip after applying a pressure to the LED substrate and/or the drive circuit substrate, the conductive layer 7 is preferably made of a material with relatively high hardness, for example, a metal with a hardness of Mohs scale 5.5 or more, including at least one of tungsten, nickel, titanium, and molybdenum.

A method of forming a drive circuit substrate is further provided in an embodiment of the present disclosure, including:

providing a base substrate;

forming a drive circuit including a plurality of driving electrodes arranged in an array on the base substrate;

forming at least one conductive structure on a surface of each drive electrode away from the base substrate, where the conductive structure is electrically connected to the corresponding drive electrode, and an orthographic projection of the conductive structure onto the base substrate is within an orthographic projection of the corresponding drive electrode onto the base substrate;

where the driving electrodes include a first driving electrode and a second driving electrode, a horizontal height of the first driving electrode is greater than a horizontal height of the second driving electrode, the conductive structure includes a first conductive structure on a surface of the first driving electrode away from the base substrate and a second conductive structure on a surface of the second driving electrode away from the base substrate, a height of the second conductive structure is greater than a height of the first conductive structure, the horizontal height of the first driving electrode is a distance between the surface of the first driving electrode away from the base substrate and a surface of the base substrate close to the first driving electrode, the horizontal height of the second driving electrode is a distance between the surface of the second driving electrode away from the base substrate and a surface of the base substrate close to the second driving electrode.

According to the above embodiment, at least one conductive structure is formed on the surface of the driving electrode of the drive circuit substrate away from the base substrate, and the conductive structure is electrically connected to the corresponding driving electrode, so that when the LED display panel is manufactured, the conductive structure on the driving electrode is inserted into the electrode of the LED chip corresponding to the driving electrode, so that the driving electrode may be electrically connected to the electrode of the LED chip, and the production precision of the conductive structure is high, thereby meeting the manufacturing requirements of the Micro-level LED display panel.

According to the above scheme, the horizontal height of the first driving electrode on the drive circuit substrate is greater than the horizontal height of the second driving electrode on the drive circuit substrate, the height of the second conductive structure on the surface of the second driving electrode away from the base substrate is greater than the height of the first conductive structure on the surface of the first driving electrode away from the base substrate, therefore after the drive circuit substrate and the LED substrate are oppositely arranged to form a cell, each driving electrode may be electrically connected to the electrode of the corresponding LED chip, thereby improving the binding yield of the LED display panel.

If the distance between adjacent conductive structures on the same driving electrode is too small, the difficulty of the preparation process is increased; if the distance between the adjacent conductive structures on the same driving electrode is too large, the number of the conductive structures on the same driving electrode is small, and the reliability of the electrical connection between the driving electrode and the electrode of the LED chip is adversely effected, so that the distance between the adjacent conductive structures in at least two conductive structures corresponding to the same driving electrode may be 3-5 μm, so that the reliability of the electrical connection between the driving electrode and the electrode of the LED chip may be ensured.

As shown in FIG. 4, each micro LED chip 5 has a first electrode 61 and a second electrode 62, and an electrical signal is applied to the first electrode 61 and the second electrode 62, so that the micro LED chip 5 may emit light. In the LED display panel, an electrical signal is transmitted to the electrodes of the micro LED chip 5 through the driving electrodes on the drive circuit substrate, and accordingly, the driving electrodes of the drive circuit substrate include the first driving electrodes 21 corresponding to the first electrodes 61 of the micro LED chip 5 and the second driving electrodes 22 corresponding to the second electrodes 62 of the micro LED chip 5.

As shown in FIG. 2 and FIG. 3, there is a level difference in the drive circuit substrate itself, for example, the horizontal height of the first driving electrode 21 is greater than the horizontal height of the second driving electrode 22, the difference between the horizontal height of the first driving electrode 21 and the horizontal height of the second driving electrode 22 is D. The horizontal height of the first driving electrode 21 is a distance from the surface of the first driving electrode 21 away from the base substrate 1 to a surface of the base substrate 1 close to the first driving electrode 21, the horizontal height of the second driving electrode 22 is a distance from the surface of the second driving electrode 22 away from the base substrate 1 to a surface of the base substrate 2 close to the second driving electrode 22. The conductive structure includes a first conductive structure 81 on a surface of the first driving electrode 21 away from the base substrate 1 and a second conductive structure 82 on a surface of the second driving electrode 22 away from the base substrate 1, where the height of the first conductive structure 81 is H1, the height of the second conductive structure 82 is H2, and the height of the conductive structure is the distance from the vertex of the conductive structure to the surface of the driving electrode away from the base substrate. In order to ensure the binding yield of the LED chips, after the LED substrate and the drive circuit substrate are oppositely arranged to form a cell, each driving electrode may be electrically connected to the electrode of the corresponding LED chip, H2 is larger than H1, a difference between H2 and H1 is not smaller than D, and the difference between H2 and H1 is not larger than 15 μm. If the difference between H2 and H1 is too large, the first conductive structure 81 may not be able to contact the electrode of the LED chip when the second conductive structure 82 is electrically connected to the electrode of the LED chip.

Specifically, before the conductive structure is formed, the drive circuit substrate may be measured to obtain the D value, and then the values of H1 and H2 may be determined according to the D value, and then the conductive structure may be formed according to the values of H1 and H2. Specifically, the entire drive circuit substrate may be measured by a level difference measuring machine to obtain the D value.

The range of the level difference of the film layer on the drive circuit substrate is about 1-5 μm, the level difference of the base substrate of the drive circuit substrate is about 10 μm. In order to ensure that each driving electrode can be electrically connected to the electrode of the corresponding LED chip after the drive circuit substrate and the LED substrate are oppositely arranged to form a cell, the height of the conductive structure may be controlled within 10-30 μm.

In this embodiment, the conductive structure includes:

a size of a cross section of the conductive structure on a plane parallel to the base substrate is inversely related to a distance from the cross section to a surface of the drive electrode.

The "inversely related" means that the larger the distance from the cross section to the surface of the driving electrode, the smaller the area of the cross section will be. When the LED display panel is manufactured, after the drive circuit substrate and the LED substrate are oppositely arranged to form a cell, the conductive structure on the drive electrode may be inserted into the electrode of the LED chip corresponding to the drive electrode by applying a pressure to the LED substrate or the drive circuit substrate, and the electric connection between the drive electrode and the electrode of the LED chip may be realized. The conductive structure may be formed by a patterning process, the patterning process has a high production precision, which may meet the manufacturing requirement of the LED display panel in a micron level.

As shown in FIG. 3, the first driving electrode 21 and the second driving electrode 22 are both provided with a conductive structure, and when the LED display panel is manufactured, after the LED substrate and the drive circuit substrate are oppositely arranged to form a cell, a pressure is applied to the LED substrate and/or the drive circuit substrate, so that the conductive structure is inserted into the electrode of the LED chip, and thus the driving electrode and the electrode of the LED chip may be electrically connected. In order to ensure the reliability of the electrical connection, a plurality of conductive structures may be disposed on each of the first driving electrodes 21 and a plurality of conductive structures may be disposed on each of the second driving electrodes 22. When a plurality of conductive structures are arranged on each driving electrode, the conductive structures are uniformly distributed as far as possible in the area opposite to the driving electrodes and the electrodes of the LED chips, so that the reliability of the electric connection between the driving electrodes and the electrodes of the LED chips may be ensured. The area opposite to the first drive electrode 21 and the first electrode 61 refers to the overlapping area of the orthographic projection of the first electrode 61 on the first drive electrode 21 and the first drive electrode 21 after the LED substrate and the drive circuit substrate are oppositely arranged to form a cell. The area opposite to the second driving electrode 22 and the second electrode 62 refers to the overlapping area of the orthographic projection of the second electrode 62 on the second driving electrode 22 and the second driving electrode 22 after the LED substrate and the drive circuit substrate are oppositely arranged to form a cell.

A shape of the conductive structure is at least one of cone, truncated cone and triangular prism, for example, the conductive structure may be a pyramid, a cone, or a triangular prism, but the conductive structure is not limited to a pyramid, a cone, and a triangular prism, and may be other types of conductive structures as long as the conductive structure can be inserted into a vertex of an electrode of an LED chip.

A bottom surface of the conductive structure is on the surface of the driving electrode away from the base substrate in a case that the conductive structure is a cone or a truncated cone, and a lateral surface of the conductive structure is on the surface of the driving electrode away from the base substrate in a case that the conductive structure is a triangular prism.

The conductive structure may be made of a conductive material, but because the limitation of the current preparation process is that the film-forming thickness of the conductive material is generally small and less than 1 micron, and the height requirement of the conductive structure cannot be met temporarily, the tapered body may be made by a dielectric material such as organic resin, then a conductive layer is formed on the tapered body, and then the conductive structure is formed by the tapered body and the conductive layer covering the tapered body.

In the embodiment of the present disclosure, the conductive structure includes a first portion and a second portion covering the first portion, an orthographic projection of the first portion onto the base substrate is within an orthographic projection of the driving electrode onto the base substrate, the second portion is in contact with the driving electrode, the second portion is conformal with a surface of the first portion away from the base substrate, the first portion is made of a dielectric material, and the second portion is made of a conductive material. In order to ensure that, as shown in FIG. 5, the first portion of the conductive structure 8 of the electrode of the conductive structure LED chip may be made to be a tapered shape, i.e. a tapered body 3; the second part needs to have conductive properties, i.e. the above-mentioned conductive layer 7.

By way of example, the dielectric material may include an organic material. Further, the organic material may include an organic resin material, as an example. For example, the organic resin material may include polyimide type resin or acrylic type resin.

By way of example, the conductive material may include aluminum, copper, molybdenum, titanium, tungsten, or the like.

The conductive structure further includes an inorganic material layer between the first portion and the second portion and covering the first portion. As shown in FIG. 5, the conductive structure 8 includes an inorganic material layer 9 between the tapered body 3 and the conductive layer 7, it is noted that the inorganic material layer 9 may protect the underlying dielectric material (i.e., the tapered body 3) during the forming of the conductive layer 7 of the conductive structure. For example, when the conductive layer 7 is formed by sputtering, the sputtered ions (e.g., metal ions) will keep striking the surface of the tapered body 3 and generate a large amount of heat, which causes deformation such as collapse of a dielectric material such as an organic material of the tapered body 3.

In the embodiment of the present disclosure, the material of the inorganic material layer 9 may include, for example, silicon nitride (SiNx), silicon oxide (SiOx), or the like.

In the embodiment of the present disclosure, the second portion of the conductive structure 8 also covers the surface of the drive electrode close to the first portion. This arrangement enables the conductive structure 8 to be more effectively electrically connected to the drive electrode 2, thereby further reducing contact resistance, as shown in the dotted rectangular box in FIG. 5.

In the embodiments of the present disclosure, the conductive structure 8 may also be made of only a conductive material.

In the embodiment of the present disclosure, the drive electrode 2 and the conductive structure 8 may be integrally formed, as shown in FIG. 6. That is, the drive electrode 2 is composed of the same material and formed in the same step as the conductive structure 8.

The driving electrode is integrally formed with the conductive structure, and a ratio of a thickness of the driving electrode to a distance from a top of the conductive structure to a bottom of the driving electrode ranges from 1:4 to 1:2.

For example, as shown in FIGS. 2 and 3, forming the conductive structure includes:

Step 1, as shown in FIG. 2, forming a tapered body by using an organic resin, where the tapered body includes a first tapered body 31 positioned on a first driving electrode 21 and a second tapered body 32 positioned on a second driving electrode 22;

when the tapered body is made of an organic photosensitive material, an organic photosensitive material layer may be formed on the base substrate 1 on which the driving electrode is formed, the organic photosensitive material layer is exposed by using a mask plate, the mask plate includes a semitransparent pattern corresponding to the forming region of the tapered body and a transparent pattern corresponding to other regions. The transmittance of the semitransparent pattern gradually decreases in a direction away from the edge close to the forming region of the tapered body. After the developing process, according to the different exposure extents, the organic photosensitive material layer are removed by different amounts at different regions, then the tapered body may be formed. The height of the tapered body can be controlled by controlling the light transmittance of the semitransparent pattern, so that the tapered bodies with different heights are formed on different driving electrodes.

Step 2, as shown in FIG. 3, forming a conductive layer 7 covering the tapered body.

Specifically, a metal layer with hardness greater than or equal to Mohs hardness 5.5 can be formed on the base substrate 1 after the step 1, a photoresist is coated on the metal layer, the photoresist is exposed by using a mask plate, the mask plate includes opaque patterns corresponding to the region where the driving electrode is located and transparent patterns corresponding to other regions, after the development, the photoresist in the region where the driving electrode is located is reserved, the photoresist in other regions is removed, the metal layer is etched by using the photoresist as a mask, namely, the conducting layer 7 only located in the region where the driving electrode is located may be formed, and then the remaining photoresist is removed.

As shown in FIG. 3, the conductive layer 7 covers not only the tapered bodies, but also the exposed driving electrodes between adjacent tapered bodies, so that the conductive structure can be electrically connected to the driving electrodes through the contact part of the conductive layer 7 and the driving electrodes.

An LED display panel is further provided in an embodiment of the present disclosure, including the drive circuit substrate hereinabove and an LED substrate oppositely arranged with the drive circuit substrate to form a cell, where the LED substrate includes a plurality of LEDs on a carrier plate, and electrodes of the LED chips and the driving electrodes of the drive circuit substrate are in a one-to-one correspondence and are electrically connected through the conductive structure.

According to the above scheme, the horizontal height of the first driving electrode on the drive circuit substrate is greater than the horizontal height of the second driving electrode on the drive circuit substrate, the height of the second conductive structure on the surface of the second driving electrode away from the base substrate is greater than the height of the first conductive structure on the surface of the first driving electrode away from the base substrate, therefore after the drive circuit substrate and the LED substrate are oppositely arranged to form a cell, each driving electrode may be electrically connected to the electrode of the corresponding LED chip, thereby improving the binding yield of the LED display panel.

According to the embodiments of the present disclosure, a size of a cross section of the conductive structure on a plane parallel to the base substrate is inversely related to a distance from the cross section to a surface of the drive electrode, and the "inversely related" means that the larger the distance from the cross section to the surface of the driving electrode, the smaller the area of the cross section will be. When the LED display panel is manufactured, after the drive circuit substrate and the LED substrate are oppositely arranged to form a cell, the conductive structure on the drive electrode may be inserted into the electrode of the LED chip corresponding to the drive electrode by applying a pressure to the LED substrate or the drive circuit substrate, and the electric connection between the drive electrode and the electrode of the LED chip may be realized. The conductive structure may be formed by a patterning process, the patterning process has a high production precision, which may meet the manufacturing requirement of the LED display panel in a Micron level.

A shape of the conductive structure is at least one of cone, truncated cone and triangular prism, for example, the conductive structure may be a pyramid, a cone, or a triangular prism, but the conductive structure is not limited to a pyramid, a cone, and a triangular prism, and may be other types of conductive structures as long as the conductive structure can be inserted into a vertex of an electrode of an LED chip.

A bottom surface of the conductive structure is on the surface of the driving electrode away from the base substrate in a case that the conductive structure is a cone or a truncated cone, and a lateral surface of the conductive structure is on the surface of the driving electrode away from the base substrate in a case that the conductive structure is a triangular prism.

The conductive structure may be made of a conductive material, but because the limitation of the current preparation process is that the film-forming thickness of the conductive material is generally small and less than 1 micron, and the height requirement of the conductive structure cannot be met temporarily, the tapered body may be made by a dielectric material such as organic resin, then a conductive layer is formed on the tapered body, and then the conductive structure is formed by the tapered body and the conductive layer covering the tapered body.

As shown in FIG. 4, in an embodiment of the present disclosure, the LED display panel includes an LED substrate and a drive circuit substrate that are oppositely disposed, the LED substrate includes a carrier plate 4 and a plurality of micro LED chips 5 on the carrier plate 4, where the carrier plate 4 may be a hard printed circuit board, an aluminum substrate with high thermal conductivity, a ceramic substrate, a soft printed circuit board, a metal composite material, etc., the carrier plate 4 may have high light transmittance or opaque, and the light transmittance of the carrier plate 4 determines the display side of the LED display panel. It can be understood that, when the micro LED chip 5 needs to be repaired, the carrier plate 4 needs to be peeled off; otherwise, the carrier plate 4 would remain in the display panel under normal conditions. The micro LED chips 5 may include a red LED chip (R LED), a green LED chip (G LED), and a blue LED chip (B LED), each of the micro LED chips 5 includes a first electrode 61 and a second electrode 62, and the LED chips emit light after electrical signals are applied to the first electrode 61 and the second electrode 62. The driving electrodes of the drive circuit substrate include a first driving electrode 21 corresponding to the first electrode 61 of the micro LED chip 5 and a second driving electrode 22 corresponding to the second electrode 62 of the micro LED chip 5, a first conductive structure 81 is arranged on the first driving electrode 21, and the first conductive structure 81 includes a first tapered body 31 and a conductive layer 7 covering the first tapered body 31; a second conductive structure 82 is disposed on the second driving electrode, and the second conductive structure 82 includes a second tapered body 32 and a conductive layer 7 covering the second tapered body 32.

As shown in FIG. 4, the first conductive structure 81 is inserted into the first electrode 61, and the second conductive structure 82 is inserted into the second electrode 62, so that the driving electrode and the electrode of the micro LED chip 5 are electrically connected.

In order to ensure the binding yield, the difference of the distances between the LED substrate and the drive circuit substrate at different positions needs to be considered when designing the height of the conductive structure. As shown in FIG. 1, after the LED substrate and the drive circuit substrate are aligned, the maximum distance between the LED substrate and the drive circuit substrate is D1, and the minimum distance between the LED substrate and the drive circuit substrate is D2, then the height H1 of the first conductive structure 81 should be greater than or equal to (D1-D2), so that it can be ensured that all the first conductive structures 81 in different regions can be inserted into the electrodes of the corresponding micro LED chips 5. The values of D1 and D2 may be empirical values, and after the LED substrate and the drive circuit substrate are aligned in the previous manufacturing process of the LED display panel, the distances between the LED substrate and the drive circuit substrate are measured to obtain the values of D1 and D2.

A method of forming an LED display panel is further provided in an embodiment of the present disclosure, including:

providing the drive circuit substrate hereinabove;

providing an LED substrate, where the LED substrate includes a plurality of LEDs on a carrier plate, and electrodes of the LED chips and the driving electrodes of the drive circuit substrate are in a one-to-one correspondence; and aligning the LED substrate with the drive circuit substrate, to electrically connect the conductive structures on the driving electrodes to the electrodes of the LED chips, and an orthographic projection of the electrode of each LED chip onto the drive circuit substrate covers an orthographic projection of a top of the conductive structure on the corresponding driving electrode onto the drive circuit substrate.

According to the above scheme, the horizontal height of the first driving electrode on the drive circuit substrate is greater than the horizontal height of the second driving electrode on the drive circuit substrate, the height of the second conductive structure on the surface of the second driving electrode away from the base substrate is greater than the height of the first conductive structure on the surface of the first driving electrode away from the base substrate, therefore after the drive circuit substrate and the LED substrate are oppositely arranged to form a cell, each driving electrode may be electrically connected to the electrode of the corresponding LED chip, thereby improving the binding yield of the LED display panel.

A display device including the LED display panel hereinabove is further provided in an embodiment of the present disclosure. The display device may be: a television, a display, a digital photo frame, a mobile phone, a tablet personal computer and any other product or component with a display function, where the display device further includes a flexible circuit board, a printed circuit board and a back plate.

In the embodiments of the methods of the present disclosure, the sequence numbers of the steps are not used to limit the sequence of the steps, and for those skilled in the art, the sequence of the steps is not changed within the scope of the present disclosure without creative work.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. The word "including" or "includes", and the like, means that the element or item preceding the word includes the element or item listed after the word and its equivalent, but does not exclude other elements or items. The terms "connected" or "coupled" and the like are not restricted to physical or mechanical connections, but may include electrical connections, whether direct or indirect. The "upper", "lower", "left", "right", and the like are used only to indicate relative positional relationships, and when the absolute position of the object being described is changed, the relative positional relationships may also be changed accordingly.

It will be understood that when an element such as a layer, film, region or substrate is referred to as being "on" or "under" another element, it can be "directly on" or "under" the other element or intervening elements may be present.

While the foregoing is directed to some embodiments of the present disclosure, it will be appreciated that various modifications and adaptations may be made by those skilled in the art without departing from the principles of the disclosure and the modifications and adaptations should be considered as within the scope of the disclosure.

The invention claimed is:

1. A drive circuit substrate, comprising a base substrate and a plurality of drive electrodes arranged in an array on a surface of the base substrate, wherein at least one conductive structure is arranged on a surface of each drive electrode away from the base substrate, the conductive structure is electrically connected to the corresponding drive electrode, and an orthographic projection of the conductive structure onto the base substrate is within an orthographic projection of the corresponding drive electrode onto the base substrate;
the driving electrodes comprise a first driving electrode and a second driving electrode, a horizontal height of the first driving electrode is greater than a horizontal height of the second driving electrode, the conductive structure comprises a first conductive structure on a surface of the first driving electrode away from the base substrate and a second conductive structure on a surface of the second driving electrode away from the base substrate, a height of the second conductive structure is greater than a height of the first conductive structure, the horizontal height of the first driving electrode is a distance from the surface of the first driving electrode away from the base substrate to a surface of the base substrate close to the first driving electrode, the horizontal height of the second driving electrode is a distance from the surface of the second driving electrode away from the base substrate to a surface of the base substrate close to the second driving electrode.

2. The drive circuit substrate according to claim 1, wherein in at least two conductive structures corresponding to a same driving electrode, a distance between adjacent conductive structures is 3 µm to 5 µm.

3. The drive circuit substrate according to claim 1, wherein a difference between the horizontal height of the first driving electrode and the horizontal height of the second driving electrode is D, the height of the first conductive structure is H1, the height of the second conductive structure is H2, and a difference between H2 and H1 is not less than D.

4. The drive circuit substrate according to claim 1, wherein the height of the conductive structure is 10 µm to 30 µm.

5. The drive circuit substrate according to claim 1, wherein a size of a cross section of the conductive structure on a plane parallel to the base substrate is inversely related to a distance from the cross section to a surface of the drive electrode.

6. The drive circuit substrate according to claim 5, wherein a ratio of a minimum dimension of a surface of the conductive structure facing the base substrate in a direction parallel to the base substrate to a distance from a top of the conductive structure to the drive electrode ranges from 1:1 to 1:3.

7. The drive circuit substrate according to claim 5, wherein a shape of the conductive structure is at least one of cone, truncated cone and triangular prism, a bottom surface of the conductive structure is on the surface of the driving electrode away from the base substrate in a case that the conductive structure is a cone or a truncated cone, and a lateral surface of the conductive structure is on the surface of the driving electrode away from the base substrate in a case that the conductive structure is a triangular prism.

8. The drive circuit substrate according to claim 5, wherein the conductive structure comprises a first portion and a second portion covering the first portion, an orthographic projection of the first portion onto the base substrate is within an orthographic projection of the driving electrode onto the base substrate, the second portion is in contact with the driving electrode, the second portion is conformal with a surface of the first portion away from the base substrate, the first portion is made of a dielectric material, and the second portion is made of a conductive material.

9. The drive circuit substrate according to claim 8, wherein the dielectric material comprises an organic material, and the conductive structure further comprises an inorganic material layer between the first portion and the second portion and covering the first portion.

10. The drive circuit substrate according to claim 9, wherein the second portion further covers a surface of the drive electrode close to the first portion.

11. The drive circuit substrate according to claim 5, wherein the conductive structure is made of a conductive material.

12. The drive circuit substrate according to claim 11, wherein the driving electrode is integrally formed with the conductive structure, and a ratio of a thickness of the driving electrode to a distance from a top of the conductive structure to a bottom of the driving electrode ranges from 1:4 to 1:2.

13. The drive circuit substrate according to claim 8, wherein a hardness of the conductive material is greater than or equal to 5.5 Mohs scale.

14. The drive circuit substrate according to claim 13, wherein the conductive material is at least one of tungsten, nickel, titanium and molybdenum.

15. A method of forming a drive circuit substrate, comprising:

provides a base substrate;

forming a drive circuit comprising a plurality of driving electrodes arranged in an array on the base substrate;

forming at least one conductive structure on a surface of each drive electrode away from the base substrate, wherein the conductive structure is electrically connected to the corresponding drive electrode, and an orthographic projection of the conductive structure onto the base substrate is within an orthographic projection of the corresponding drive electrode onto the base substrate;

wherein the driving electrodes comprise a first driving electrode and a second driving electrode, a horizontal height of the first driving electrode is greater than a horizontal height of the second driving electrode, the conductive structure comprises a first conductive structure on a surface of the first driving electrode away from the base substrate and a second conductive structure on a surface of the second driving electrode away from the base substrate, a height of the second conductive structure is greater than a height of the first conductive structure, the horizontal height of the first driving electrode is a distance between the surface of the first driving electrode away from the base substrate and a surface of the base substrate close to the first driving electrode, the horizontal height of the second driving electrode is a distance between the surface of the second driving electrode away from the base substrate and a surface of the base substrate close to the second driving electrode.

16. An LED display panel, comprising the drive circuit substrate according to claim 1 and an LED substrate oppositely arranged with the drive circuit substrate to form a cell, wherein the LED substrate comprises a plurality of LEDs on a carrier plate, and electrodes of the LED chips and the driving electrodes of the drive circuit substrate are in a one-to-one correspondence and are electrically connected through the conductive structure.

17. A method of forming an LED display panel, comprising:

providing the drive circuit substrate according to any one of claim 1;

providing an LED substrate, wherein the LED substrate comprises a plurality of LEDs on a carrier plate, and electrodes of the LED chips and the driving electrodes of the drive circuit substrate are in a one-to-one correspondence; and aligning the LED substrate with the drive circuit substrate, to electrically connect the conductive structures on the driving electrodes to the electrodes of the LED chips, and an orthographic projection of the electrode of each LED chip onto the drive circuit substrate covers an orthographic projection of a top of the conductive structure on the corresponding driving electrode onto the drive circuit substrate.

18. The method of forming the LED display panel according to claim 17, wherein applying a pressure onto the LED substrate or the drive circuit substrate according to claim 5, to insert the conductive structure on the driving electrode into the electrode of the LED chip corresponding to the driving electrode.

19. The method of forming the LED display panel according to claim 17, wherein in a case that the LED substrate is aligned with the drive circuit substrate, a maximum distance between the LED substrate and the drive circuit substrate is D1, a minimum distance between the LED substrate and the drive circuit substrate is D2, a height of the first conductive structure is H1, and H1 is greater than or equal to (D1−D2).

20. A display device comprising the LED display panel according to claim 16.

\* \* \* \* \*